United States Patent
Ishizaki et al.

(10) Patent No.: US 8,117,217 B2
(45) Date of Patent: Feb. 14, 2012

(54) INFORMATION PROCESSING APPARATUS AND ENCODING METHOD

(75) Inventors: Tooru Ishizaki, Kawasaki (JP); Keisuke Tamiya, Kawasaki (JP); Satoshi Imaizumi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 542 days.

(21) Appl. No.: 12/205,299

(22) Filed: Sep. 5, 2008

(65) Prior Publication Data

US 2009/0083315 A1    Mar. 26, 2009

(30) Foreign Application Priority Data

Sep. 20, 2007    (JP) ................. 2007-244443

(51) Int. Cl.
*G06F 7/00* (2006.01)
(52) U.S. Cl. ......... 707/756; 707/708; 707/709; 707/755
(58) Field of Classification Search ........... 707/708, 707/709, 755, 756
See application file for complete search history.

(56) References Cited

U.S. PATENT DOCUMENTS

| | | | | |
|---|---|---|---|---|
| 6,374,253 | B1* | 4/2002 | Weider et al. | 1/1 |
| 7,136,526 | B2* | 11/2006 | Hotta et al. | 382/187 |
| 2002/0065822 | A1* | 5/2002 | Itani | 707/7 |
| 2002/0161801 | A1* | 10/2002 | Hind et al. | 707/513 |
| 2005/0138542 | A1* | 6/2005 | Roe et al. | 715/513 |
| 2007/0208705 | A1* | 9/2007 | Whitehead | 707/3 |
| 2008/0030383 | A1* | 2/2008 | Cameron | 341/55 |

FOREIGN PATENT DOCUMENTS

| | | |
|---|---|---|
| JP | 2005215940 A1 | 8/2005 |
| JP | 2005215950 A1 | 8/2005 |

OTHER PUBLICATIONS

Rohme et al., Proc. 3rd INT. Workshop Integration over the Web (DIWEB), 2004, pp. 1-12.*
Bayrak et al., Integrated Design and Process Technology, IDPT-2002, pp. 1-8, 2002.*

* cited by examiner

*Primary Examiner* — Cheyne Ly
(74) *Attorney, Agent, or Firm* — Fitzpatrick, Cella, Harper & Scinto

(57) ABSTRACT

There is provided an information processing apparatus for providing encoding technology that enables data size reductions and analysis processing speed improvements even for data including elements having complex attribute values. The apparatus includes a file input unit that inputs a file including elements having a data stream of a predetermined format as an attribute value, a hierarchy information setting unit that sets hierarchy information indicating hierarchical positions for each of one or more delimiters included in the data stream, a structure information generating unit that generates structure information that defines mutual relations between hierarchy information, a designating unit that designates a region of a data stream of a predetermined format from the input file, and an encoding unit that detects delimiters from the designated region and, based on detected delimiters and structure information, encodes a data stream of the designated region based on a preset structured description language.

6 Claims, 24 Drawing Sheets

FIG. 2

SVG
```
<svg>
 <g>
  <path d ="M 434.228 , 228.562 c 0.185 , -1.12 , 0.247 , -2.1 , 0.247 , -3.612 c 0 ,
  -1.344 , -0.063 , -2.353 , -0.247 , -3.612 c 1.324 , 0.057 , 2.279 , 0.084 , 3.912 ,
  0.084 ......
 </g>
</svg>
```

DRAWING PROCESSING

SVG DRAWING PROCESSING FUNCTION

SVG_MoceTo(xxx, 434.228, 228.562)   SVG_CurveTo(xxx, 0.185, -1.12, 0.247, -2.1, 0.247, -3.612)

TO ACHIEVE MORE EFFICIENT PROCESSING AND SIZE REDUCTION, ATTRIBUTE VALUES ARE ENCODED WITH THE ARRAY REPRESENTATION SHOWN BELOW

ARRAY M
M[0] = 434.228
M[1] = 228.562

ARRAY c
c[0] = 0.185
c[1] = -1.12
c[2] = 0.247
c[3] = -2.1
c[4] = 0.247
c[5] = -3.612

FIG. 4
DESIGNATION OF HIERARCHY INFORMATION
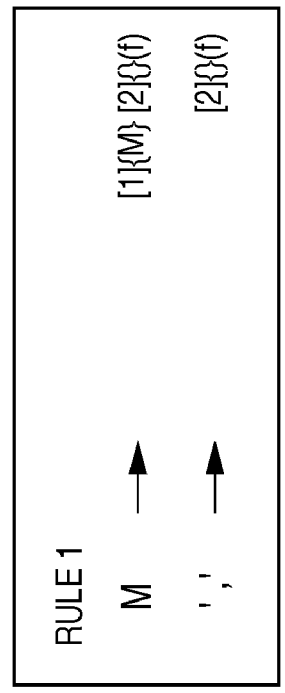
RULE 1
M        [1]{M} [2]{}(f)
         [2]{}(f)
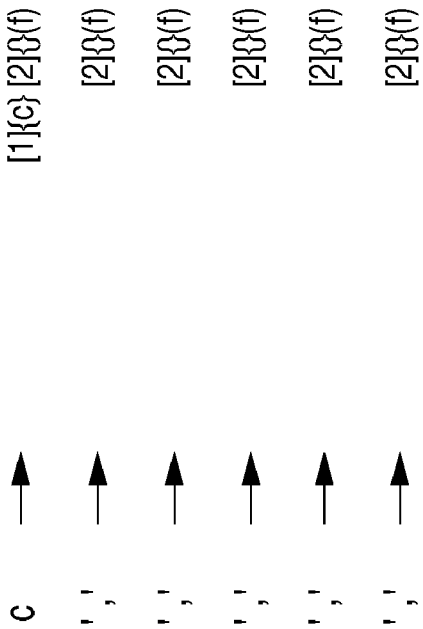
RULE 2
C        [1]{C} [2]{}(f)
         [2]{}(f)
         [2]{}(f)
         [2]{}(f)
         [2]{}(f)
         [2]{}(f)
[ ] LAYER
{ } IDENTIFIER NAME
( ) DATA TYPE; f DENOTES float TYPE

FIG. 11

TRANSLATION TABLE FOR IDENTIFIER NAME AND CODE

| name | CODE |
|------|------|
| M | 0000 |
| m | 0001 |
| C | 0010 |
| c | 0011 |
| ... | ... |
| null | 1111 |

TRANSLATION TABLE FOR DATA TYPE AND CODE

| value_type | CODE |
|------------|------|
| float | 0000 |
| double | 0001 |
| int | 0010 |
| ... | ... |

FIG. 13

SVG

```
<svg>
<g>
  <animate Transform type="translate" values="-68 , -418 ; -101.49 , -446.71 ;
  -126.52 , -465.24 ; -139.49 , -469.29 ; -139.8 , -458.14 ; -129.69 , -434.47 ;
  -113.52 , -403.53 ; -96.63 , -371.72 ; · · · · · ·  "

keyTimes="0 ; 0.01 ; 0.02 ; 0.03 ; 0.05 ; 0.06 ; 0.07 ; 0.08 ; 0.1 ; 0.11 ; 0.12 ; 0.13 ;
  0.15 ; 0.16 ; 0.17 ; 0.18 ; 0.2 ; · · · · · ·  "

dur = "4s"
  />
</g>
</svg>
```

RELATEDNESS OF VALUES

| values | | keyTimes |
|---|---|---|
| -68 , -418 | <-> | 0 |
| -101.49 , -446.71 | <-> | 0.01 |
| -126.52 , -465.24 | <-> | 0.02 |
| ⋮ | | ⋮ |

ENCODING WITH ARRAY REPRESENTATION THAT TAKES
INTO CONSIDERATION RELATEDNESS OF VALUES

| values ATTRIBUTE | keyTimes ATTRIBUTE |
|---|---|
| values[0][0] = -68 | keyTimes[0] = 0 |
| values[0][1] = -418 | |
| values[1][0] = -101.49 | keyTimes[1] = 0.01 |
| values[1][1] = -446.71 | |
| values[2][1] = -126.52 | keyTimes[2] = 0.02 |
| values[2][2] = -465.24 | |
| ⋮ | ⋮ |

FIG. 14
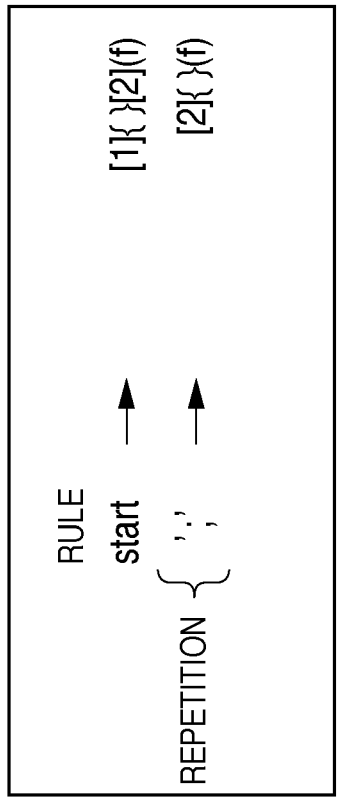
DESIGNATION OF HIERARCHY INFORMATION FOR keytimes ATTRIBUTE
RULE
start → [1]{ }[2](f)
REPETITION { → [2]{ }(f)
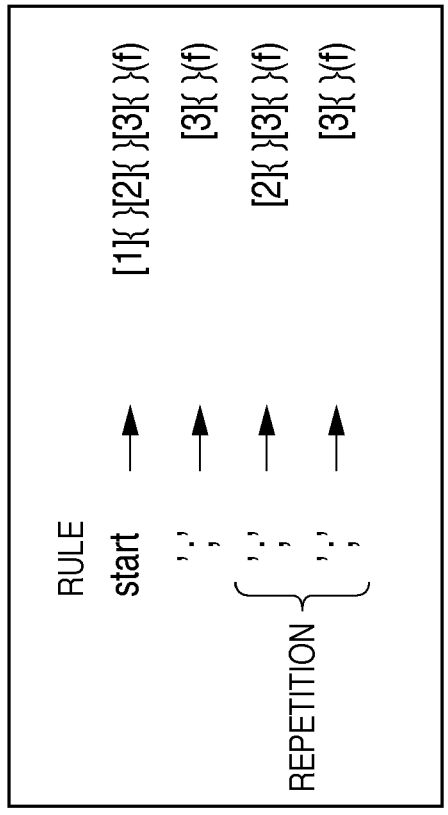
DESIGNATION OF HIERARCHY INFORMATION FOR values ATTRIBUTE
RULE
start → [1]{ }[2]{ }[3]{ }(f)
→ [3]{ }(f)
REPETITION { → [2]{ }[3]{ }(f)
→ [3]{ }(f)
[ ]   LAYER
{ }   IDENTIFIER NAME
( )   DATA TYPE; f DENOTES float TYPE

FIG. 17

SVG

```
<svg>
<g transform="matrix(0.185 , -1.12 , 0.247 , -2.1 , 0.247 , -3.612)">
        ⋮

</g>
</svg>
```

REPRESENTING TRANSFORMATION MATRIX $$\begin{bmatrix} 0.185 & 0.247 & 0.247 \\ -1.12 & -2.1 & -3.612 \\ 0 & 0 & 1 \end{bmatrix}$$

ENCODING WITH ARRAY REPRESENTATION
THAT TAKES INTO CONSIDERATION MATRIX STRUCTURE

COLUMN ROW
matrix [0] [0] = 0.185
matrix [0] [1] = -1.12
matrix [1] [0] = 0.247
matrix [1] [1] = -2.1
matrix [2] [0] = 0.247
matrix [2] [1] = -3.612

FIG. 18

DESIGNATION OF HIERARCHY INFORMATION
FOR matrix OF transform ATTRIBUTE

RULE matrix( → [1]{matrix}[2]{ }[3]{ }(f)

',' → [3]{ }(f)

',' → [2]{ }[3]{ }(f)

',' → [3]{ }(f)

',' → [2]{ }[3]{ }(f)

',' → [3]{ }(f)

')' → delete

[ ] LAYER

{ } IDENTIFIER NAME ( ) DATA TYPE; f DENOTES float TYPE

FIG. 21

```
<soap:envelope>
  <soap:body>
    <myMethod>
      <x xsi:type="xsd:int">5</x>
      <y xsi:type="xsd:float">5.078</y>
    </myMethod>
  </soap:body>
</soap:envelope>
```

ENCODING OF METHOD INVOCATION INTO XML MESSAGE myMethod(5, 5.078)

ENCODING USING ARRAY STRUCTURE myMethod [0] = 15032 (int)
myMethod [1] = 5.078 (float)

FIG. 22

DESIGNATION OF HIERARCHY INFORMATION
FOR myMethod SUB-ELEMENT

| RULE | | |
|---|---|---|
| myMethod ELEMENT | → | [1]{myMethod} |
| x ELEMENT | → | [2]{ }(i) |
| y ELEMENT | → | [2]{ }(f) |

[ ]   LAYER

{ }   IDENTIFIER NAME ( )   DATA TYPE; f DENOTES float TYPE

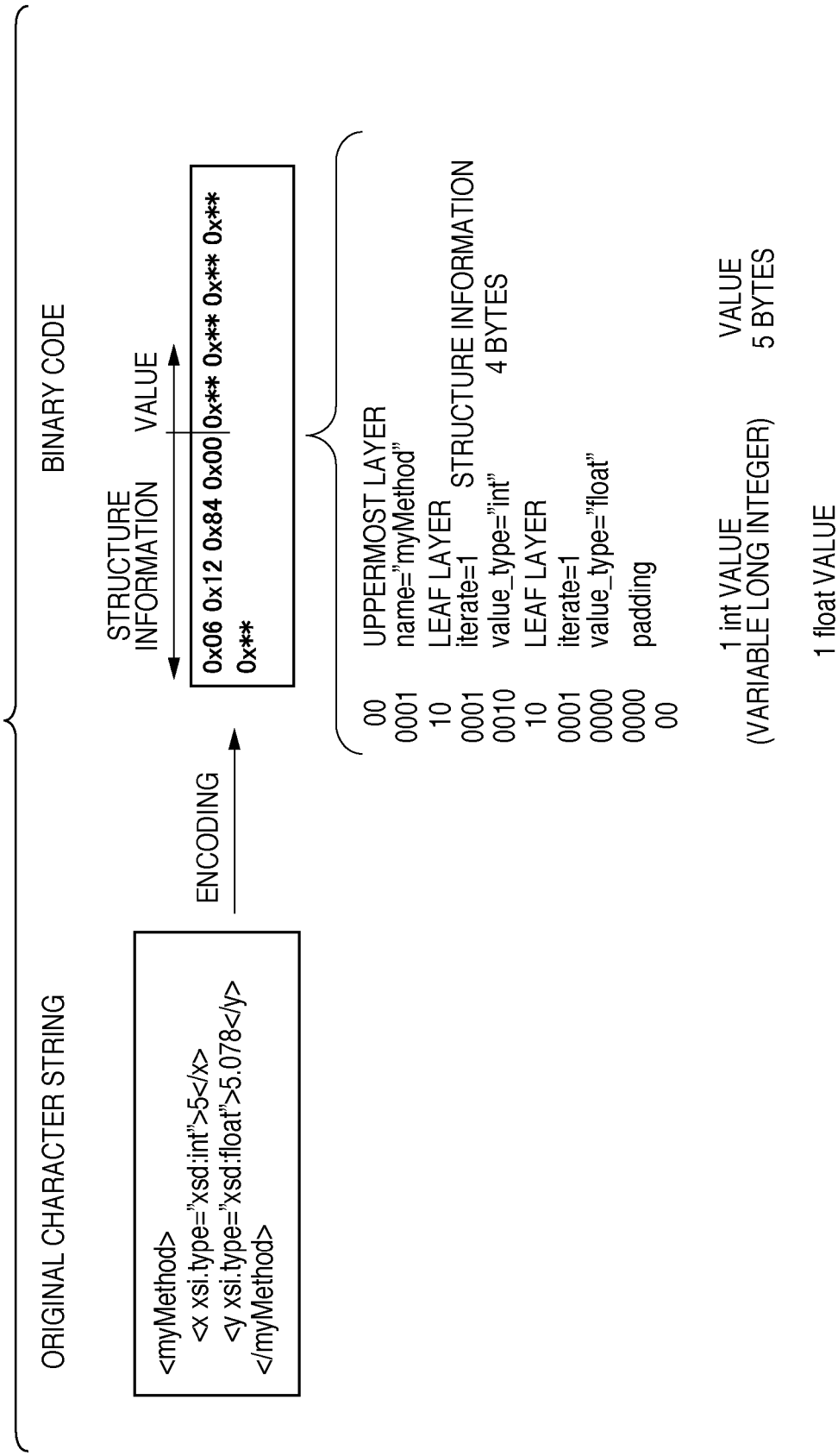

INFORMATION PROCESSING APPARATUS AND ENCODING METHOD

BACKGROUND OF THE INVENTION

1. Field of the Invention

The present invention relates to encoding technology for structured document data.

2. Description of the Related Art

Conventionally, in XML (extensible markup language) language specifications developed by W3C, when encoding data in XML format, the encoding (text encoding) is commonly performed using a method such as UTF-8 or UTF-16.

In contrast, for devices with few hardware resources, such as mobile phones, digital cameras, and printers, a reduction in the size of XML data and speeding up of parse processing are demanded. In order to satisfy these demands, an encoding technology referred to as "binary XML" has also come into use in recent years. With binary XML, structures such as XML elements or attributes are encoded into binary data, and the values of elements or attributes are encoded with the original data type such as integers and decimals. By encoding into binary data, the data size decreases and the parse processing is speeded up more than in a case of text encoding such as UTF-8 or UTF-16.

Further, according to Fast Infoset specifications developed by ISO (ISO/IEC 24824-1, 2007), attribute values or element contents within XML data can be encoded in a binary format that is suitable to the original data type, such as integer and decimals. It is therefore possible to realize further decreases in data sizes and reductions in data processing times.

However, there are the following problems with the aforementioned data encoding technology. For example, in some cases the values of complex data structures, not just simple data types such as integers or decimals, are described as attribute values or the contents (values) of elements. For example, in document data in SVG (scalable vector graphics) format, a complex value in which a drawing command or coordinates information is incorporated is described as an attribute value. In such a case, it is difficult to recognize and encode the data structure in a general-purpose manner. If only encoding a data structure, encoding into text-format XML can also be performed using, for example, SOAP encoding. However, according to this method, since the data size becomes larger than the original data size and character string analysis processing is required, the original objectives of reducing the data size and making processing more efficient are not achieved. Consequently, it has been common to encode data as a series of character strings as in the case of text XML.

More specifically, when performing text encoding, even when data that is described as an attribute value or as element contents is data other than a character, such as an integer or a decimal, the data has had to be encoded as a character. When a numerical value is encoded using characters, the data size becomes larger than when encoding with a binary representation and time is also required for processing. Therefore, in a case where these kind of unique structures occupy a large portion of document data, as in the case of the aforementioned SVG, it has been difficult to realize size reductions or speeding-up of parsing and the like.

SUMMARY OF THE INVENTION

The present invention was made in view of the above-described problems, and an object of this invention is to provide encoding technology with which effects of reducing data sizes and improving analysis processing speeds can be obtained even with respect to data that includes elements that have complex attribute values.

According to one aspect of the present invention, there is provided an information processing apparatus, comprises: a file input unit that inputs a file including an element having a data stream of a predetermined format as an attribute value; a hierarchy information setting unit that, with respect to each of one or more delimiters included in the data stream of the predetermined format, sets hierarchy information that indicates a hierarchical position in the data stream of data relating to the delimiter; a structure information generating unit that generates structure information that defines a mutual relation between one or more pieces of hierarchy information that are set with the hierarchy information setting unit; a designating unit that designates a region of the data stream of the predetermined format from a file that is input by the file input unit; and an encoding unit that detects the delimiter from the region that is designated by the designating unit, and encodes a data stream of the region based on a preset structured description language, based on the detected delimiter and the structure information.

According to another aspect of the present invention, there is provided an encoding method, comprises: a file input step of inputting a file including an element having a data stream of a predetermined format as an attribute value; a hierarchy information setting step of setting, with respect to each of one or more delimiters included in the data stream of the predetermined format, hierarchy information that indicates a hierarchical position in the data stream of data relating to the delimiter; a structure information generating step of generating structure information that defines a mutual relation between one or more pieces of hierarchy information that are set in the hierarchy information setting step; a designating step of designating a region of the data stream of the predetermined format from a file that is input in the file input step; and an encoding step of detecting the delimiter from the region that is designated in the designating step, and encoding a data stream of the region based on a preset structured description language, based on the detected delimiter and the structure information.

According to the present invention, it is possible to provide encoding technology with which effects of reducing data sizes and improving analysis processing speeds can be obtained even with respect to data that includes elements that have complex attribute values.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 2 is a view that illustrates an example of SVG format data (first embodiment);

FIG. 4 is a view that illustratively shows an example of designation of hierarchy information (first embodiment);

FIG. 11 is a view that illustrates an example of a translation table;

FIG. 13 is a view that illustrates an example of SVG format data (second embodiment);

FIG. 14 is a view that illustratively shows designation of hierarchy information (second embodiment);

FIG. 17 is a view that illustrates an example of SVG format data (third embodiment);

FIG. 18 is a view that illustratively shows designation of hierarchy information (third embodiment);

FIG. 21 is a view that illustratively shows a description that converts a method invocation into message data;

FIG. 22 is a view that illustratively shows designation of hierarchy information (fourth embodiment);

FIG. 24 is a view that shows a result obtained after executing binary encoding with respect to values of a "soap:body" element shown in FIG. 21.

DESCRIPTION OF THE EMBODIMENTS

Preferred embodiments of the present invention are described in detail hereunder with reference to the attached drawings. The following embodiments are for illustrative purposes only and are not intended to limit the scope of the present invention.

First Embodiment

Figure 1:
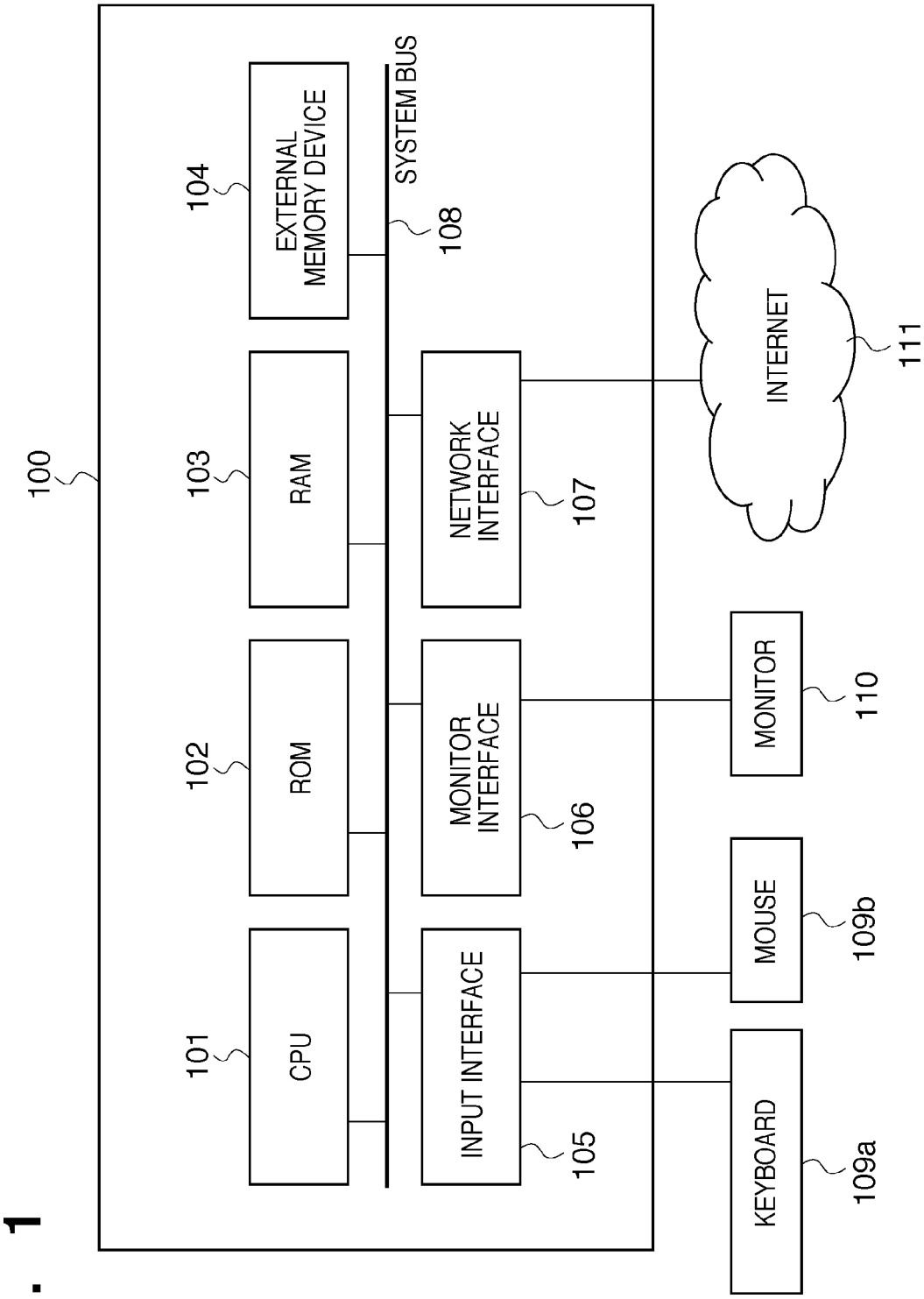
FIG. 1 is a block diagram of computer devices that comprise a data encoding apparatus according to a first embodiment.

A data encoding apparatus that processes SVG format data is described hereunder as a first embodiment of the information processing apparatus according to the present invention.
<Apparatus Configuration>
FIG. 1 is a block diagram of computer devices that comprise a data encoding apparatus according to the first embodiment. In this connection, the data encoding apparatus may be implemented by respective individual computer devices or, as necessary, may be implemented by distributing functions thereof among a plurality of computer devices. When configuring the data encoding apparatus using a plurality of computer devices, the plurality of computer devices are connected to each other via a LAN or the like to enable communication between the computer devices.

Reference numeral 101 denotes a CPU (central processing unit) that performs overall control of a data encoding apparatus 100. Reference numeral 102 denotes a ROM that stores programs and parameters. Reference numeral 103 denotes a RAM that temporarily stores data or programs that are supplied from an external device or the like.

Reference numeral 104 denotes an external memory device such as a hard disk or a memory card reader that is connected to the data encoding apparatus 100. A detachable magnetic disk or optical disk or the like may be used as the external memory device 104. Reference numeral 105 denotes an input interface for connecting with an input device for accepting a user operation to input data. As the input device, a keyboard 109a and a mouse 109b as a pointing device or the like are provided.

Reference numeral 106 denotes a monitor interface for connecting with a monitor 110 for displaying supplied data or data that is kept in the data encoding apparatus 100. Reference numeral 107 denotes a network interface for connecting to a network such as an Internet 111. Reference numeral 108 denotes a system bus that connects each of the aforementioned parts with each other.

<Apparatus Operation>
Overall Operation

FIG. 2 is a view that shows an example of SVG (scalable vector graphics) format data. In the SVG format data, a combination of drawing commands such as "M" or "c" and coordinate information such as "434.228" or "228.562" is described in an attribute value.

Figure 3:
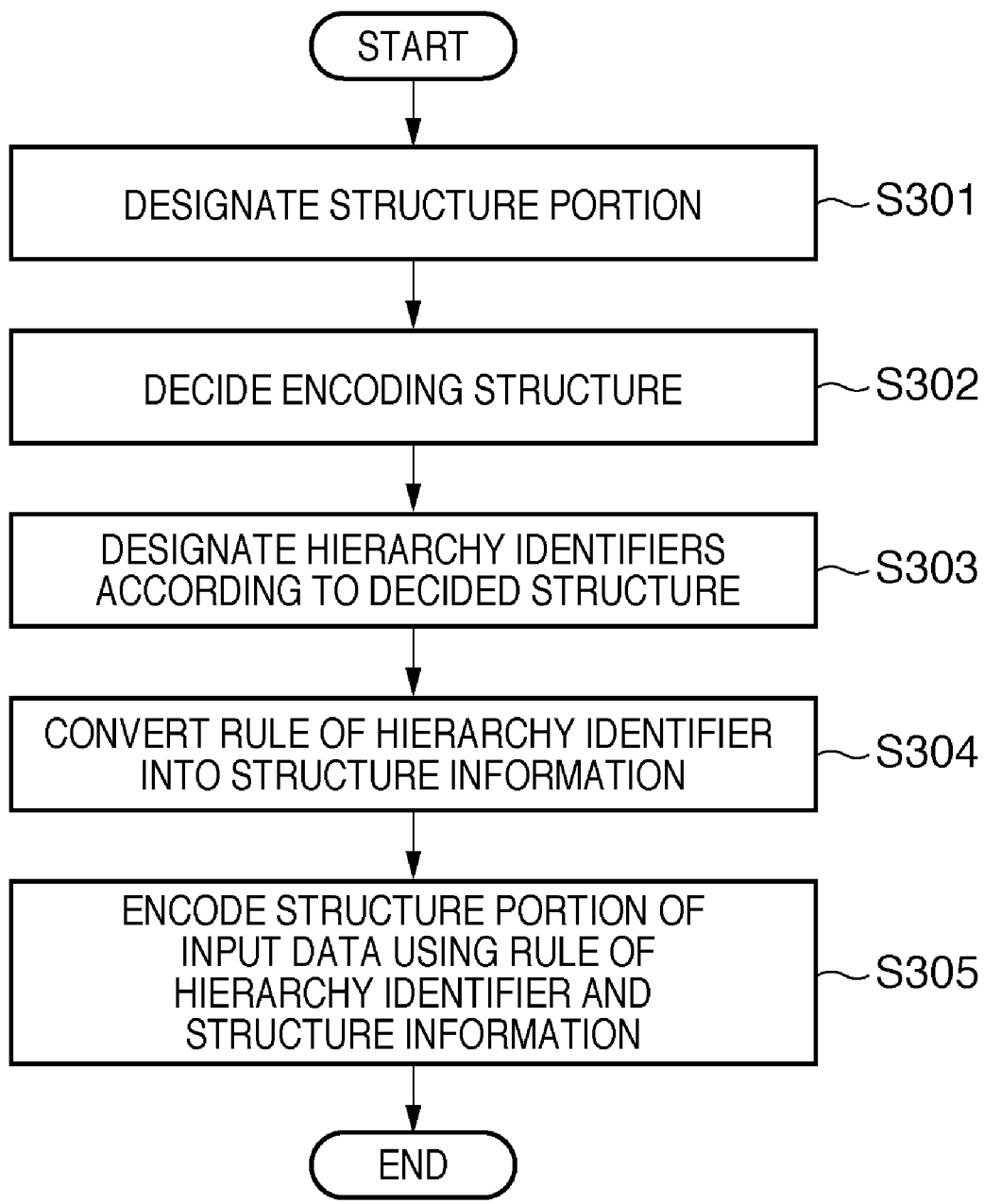
FIG. 3 is a view showing a flowchart of operations of an information processing apparatus according to the first embodiment.

FIG. 3 is an operation flowchart of the information processing apparatus according to the first embodiment. A method of encoding the SVG data shown in FIG. 2 will now be described. In this connection, each of the following steps is implemented by the CPU 101 of the data encoding apparatus 100 executing a program.

In step S301, the CPU 101 reads in (file input unit) SVG data (file) and designates a processing target portion (structure portion) included in the SVG data. That is, the CPU 101 designates a region of a data stream in a predetermined format to serve as the object of processing performed thereafter. In this case, designation of a portion of a value of a d attribute of the "path" element of the SVG data shown in FIG. 2 is accepted. For this processing, the data encoding apparatus 100 may be configured so as to automatically designate a region based on a predefined condition or may be configured to accept a designation from a user via an input device. In this connection, as the predefined condition, the name of an attribute and an element may be designated, or the threshold value of a data length of the contents (value) of an attribute and an element may be set.

In step S302, a data structure is determined with respect to a processing target portion that is designated in step S301. A configuration may also be adopted in which the data structure is determined by accepting a designation from a user via an input device. In this case, in consideration of the processing efficiency, an array structure in drawing command units as shown in the bottom columns in FIG. 2 is designated.

In step S303, hierarchy information is set with respect to the data stream of the processing target portion that is designated in step S301 in accordance with the data structure determined in step S302 (hierarchy information setting unit). More specifically, with respect to a delimiter included in the processing target portion designated in step S301, an identifier and a hierarchy (hierarchical position) represented by data relating to the delimiter are designated.

FIG. 4 is a view that illustratively shows designation of hierarchy information. The hierarchy information comprises a hierarchy and an identifier name for each delimiter. A delimiter is a character that serves as a boundary of data, and can be arbitrarily designated by the user. In this case, "M", "c", and "," are taken as delimiters.

A hierarchy is used for showing the inclusion relation of character strings that are delimited by delimiters. In this case, drawing command characters "M" and "c" that are array units are in the uppermost hierarchy. A delimiter for a decimal "," is in the second hierarchy.

Identifier names are for distinguishing characters in the same hierarchy. In this case, the drawing command characters "M" and "c" are designated to distinguish the arrays. If it is not necessary to distinguish arrays, a drawing command character need not be designated.

In this connection, a data type designation can also be made in the hierarchy information (data type setting unit). By designating a data type, when performing encoding described later (S907), it is possible to efficiently encode individual values that are delimited by delimiters according to the designated data type in question. In this case, "float" type is designated with respect to character strings of coordinate information.

In step S304, the hierarchy information designated in step S303 is converted into structure information (structure information generating unit). More specifically, based on the hierarchy information designated in step S303, structure information is generated that defines the mutual relationship between each piece of hierarchy information.

Figure 5:
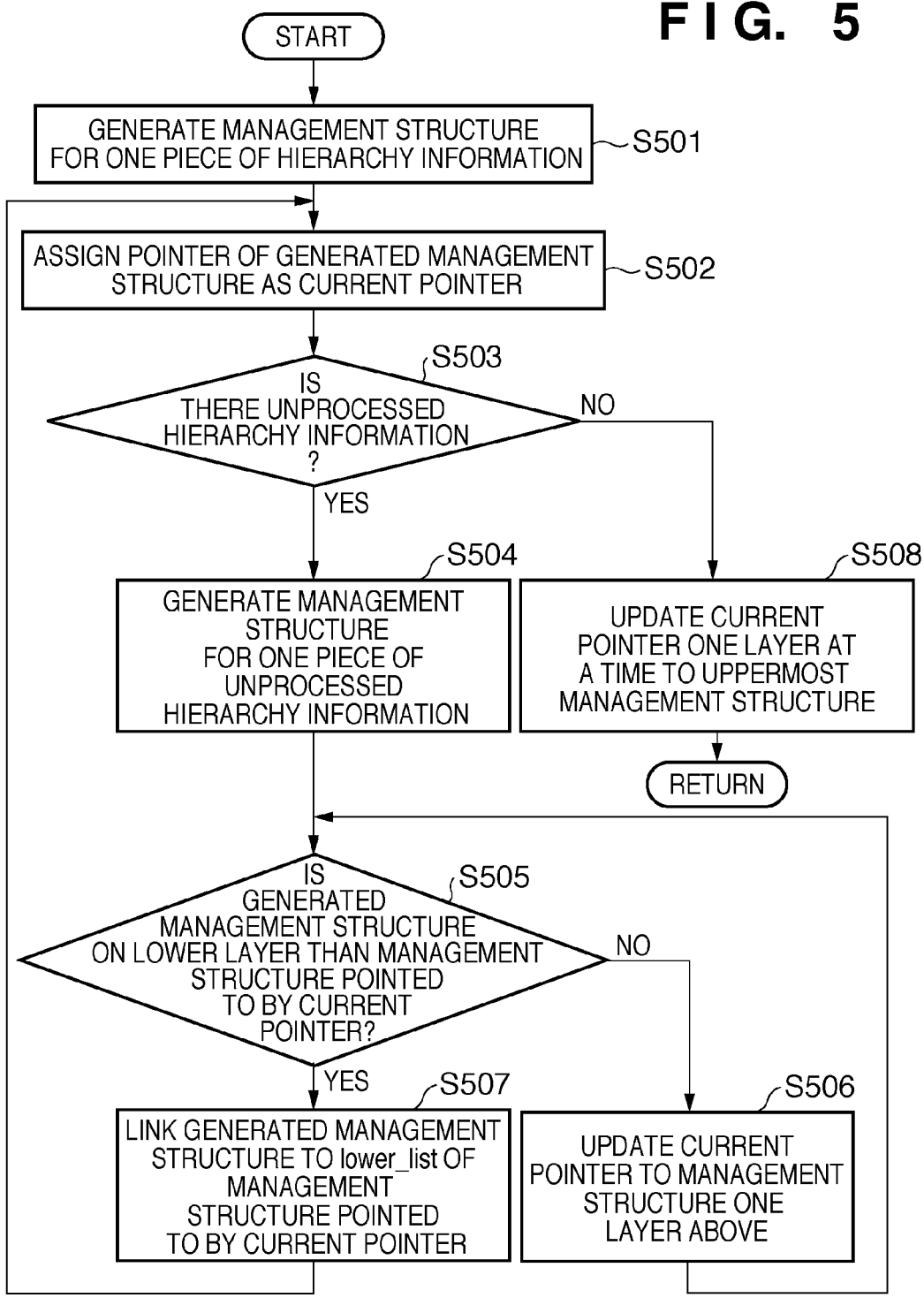
FIG. 5 is a view that illustrates a flowchart of detailed operations that convert hierarchy information of rule 2 shown in FIG. 4 into structure information.
Figure 6:
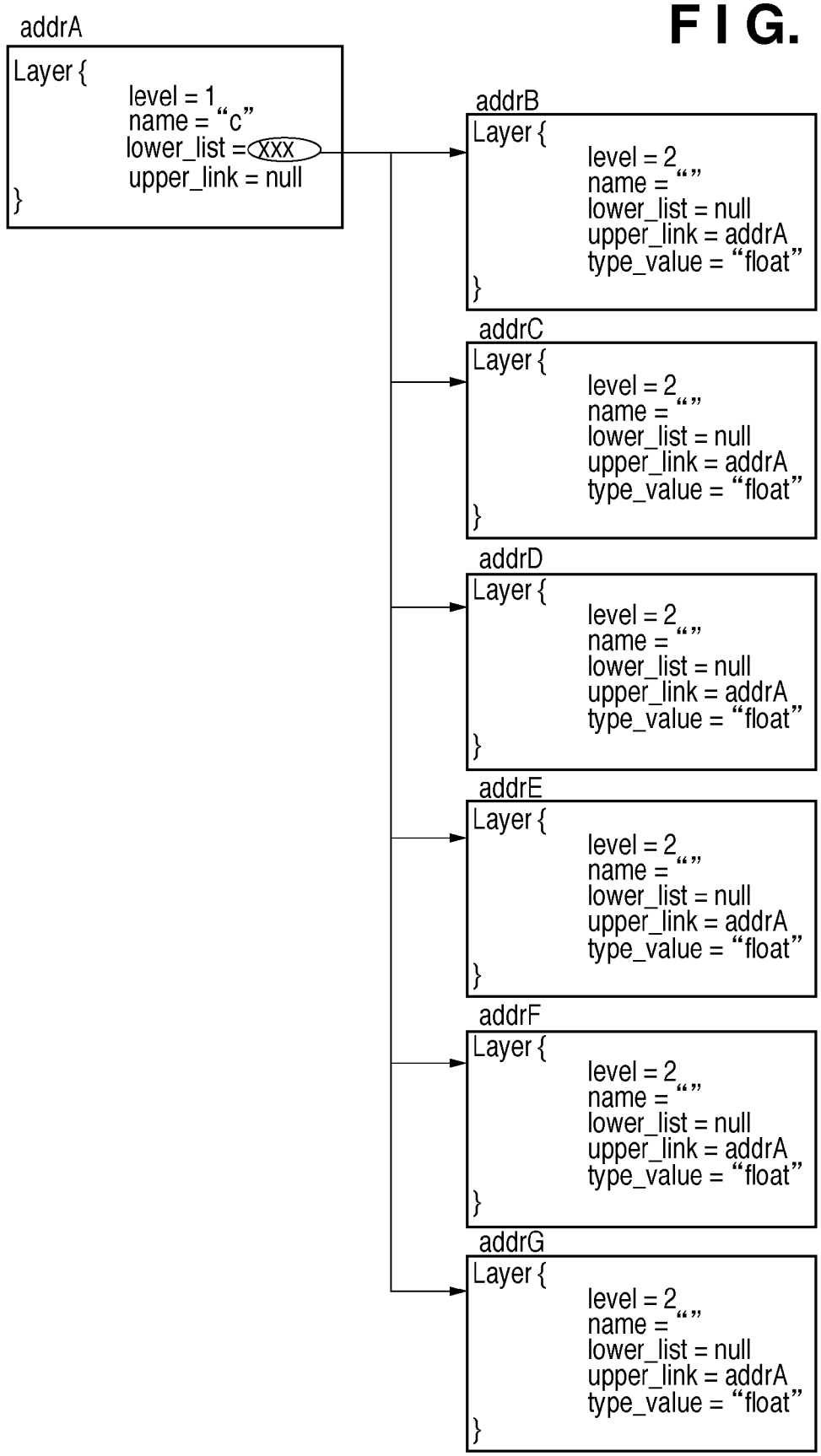
FIG. 6 is a view that illustratively shows a result obtained by converting hierarchy information into structure information (first embodiment)

FIG. 6 is a view that illustratively shows a result obtained by converting hierarchy information of "rule 2" shown in FIG. 4 into structure information. The structure information is composed of one or more management structures. For each management structure is described a hierarchy (layer), an identifier name (name), and a data type (value_type). Further, a list of management structures in the lower hierarchy (lower_list) and a link to management structures in the upper hierarchy (upper_link) are also described together. The relationship between management structures is described in lower_link and upper_link. When there is a plurality of lower hierarchies, the hierarchies are linked to lower_list in the order of appearance in the document. The management structure does not depend on a specific programming language. Details of processing to convert hierarchy information into structure information are described later referring to FIG. 5 to FIG. 8.

In step S305, SVG data that is input in step S301 is encoded using the hierarchy identifier designated in step S303 and the structure information that is obtained by conversion in step S304. More specifically, encoding is performed based on a structured description language such as text XML or binary XML. Details of the relevant encoding processing are described later referring to FIG. 9 to FIG. 12.

Details of Processing Operations That Convert Hierarchy Information Into Structure Information (Step S304)

FIG. 5 is a flowchart of detailed operations that convert hierarchy information of rule 2 shown in FIG. 4 into structure information.

In step S501, a management structure is generated with respect to the hierarchy information that is initially designated. According to rule 2, the hierarchy information [1] {c} [2] { } (f) is designated for the delimiter "c". Therefore, a management structure "addrA" is generated with respect to the hierarchy information [1] {c}, and level=1, name="c" are described.

In step S502, the pointer of "addrA" is assigned as the current pointer. The current pointer is for indicating the management structure that is currently being processed, and is used in processing that is described later.

In step S503, the CPU 101 checks whether or not there is unprocessed hierarchy information inside the rule. When unprocessed hierarchy information exists, the operation proceeds to step S504, and when there is none, the operation proceeds to step S508.

In step S504, a management structure is generated for one piece of unprocessed hierarchy information. According to rule 2, since the hierarchy [2] { } (f) follows the hierarchy [1] {c}, a management structure "addrB" is generated, and level=2, value_type="float" are described.

The newly generated management structure must be linked to the lower_list of the management structure of the upper hierarchy. This processing is performed utilizing the current pointer.

In step S505, the CPU 101 checks whether or not the management structure generated in step S504 is lower than the hierarchy of the management structure that is pointed to by the current pointer. If the management structure generated in step S504 is in a lower hierarchy, the operation proceeds to step S507. If the management structure is not in a lower hierarchy, the operation proceeds to step S506.

In step S506, the current pointer is assigned to a management structure in a hierarchy that is one hierarchy above the management structure pointed to by the current pointer. Thereafter, the operation returns to step S505.

In step S507, the CPU 101 detects the lower_list of the management structure pointed to by the current pointer, and links the generated management structure. After linking, the CPU 101 returns to step S502.

For example, when the newly generated management structure is "addrB", the current pointer points to "addrA". Since the "level" of "addrB" is lower than a "level" of "addrA", "addrB" is linked to the lower_list of "addrA". When the newly generated management structure is "addrC", the current pointer points to "addrB". Since the "level" of "addrB" is the same as that of "addrC", the upper hierarchy is followed. Since the upper hierarchy is "addrA", the pointer of "addrA" is assigned as the current pointer. Since the "level" of "addrA" is lower than the "level" of "addrC", "addrC" is linked to the lower_list of "addrA". The same processing is performed for "addrD" and the subsequent management structures. The same processing is also performed with respect to rule 1.

In step S508, the current pointer is updated to an upper hierarchy one hierarchy at a time, and the processing ends when the current pointer arrives at the uppermost hierarchy.

FIG. 6 is a view that illustratively shows structure information generated by the processing shown in FIG. 5. As shown in FIG. 6, there are cases in which management structures with the same structure repeatedly appear within structure information. In the example shown in FIG. 6, management structures with the same structure appear at level=2. Consequently, the data size when encoding can be reduced by representing these management structures in a summarized manner. It is also favorable to perform this processing using the current pointer.

The structure information is in a nested structure. When the current pointer is updated to an upper hierarchy, the current pointer does not return to the pre-update management structure. That is, new information is not added to the pre-update management structure. Therefore, at the time the current pointer is updated to an upper hierarchy, the CPU 101 performs collection processing with respect to the pre-update management structure (information collecting unit). In this case, the management structure at this time is referred to as a closed_structure.

Figure 7:
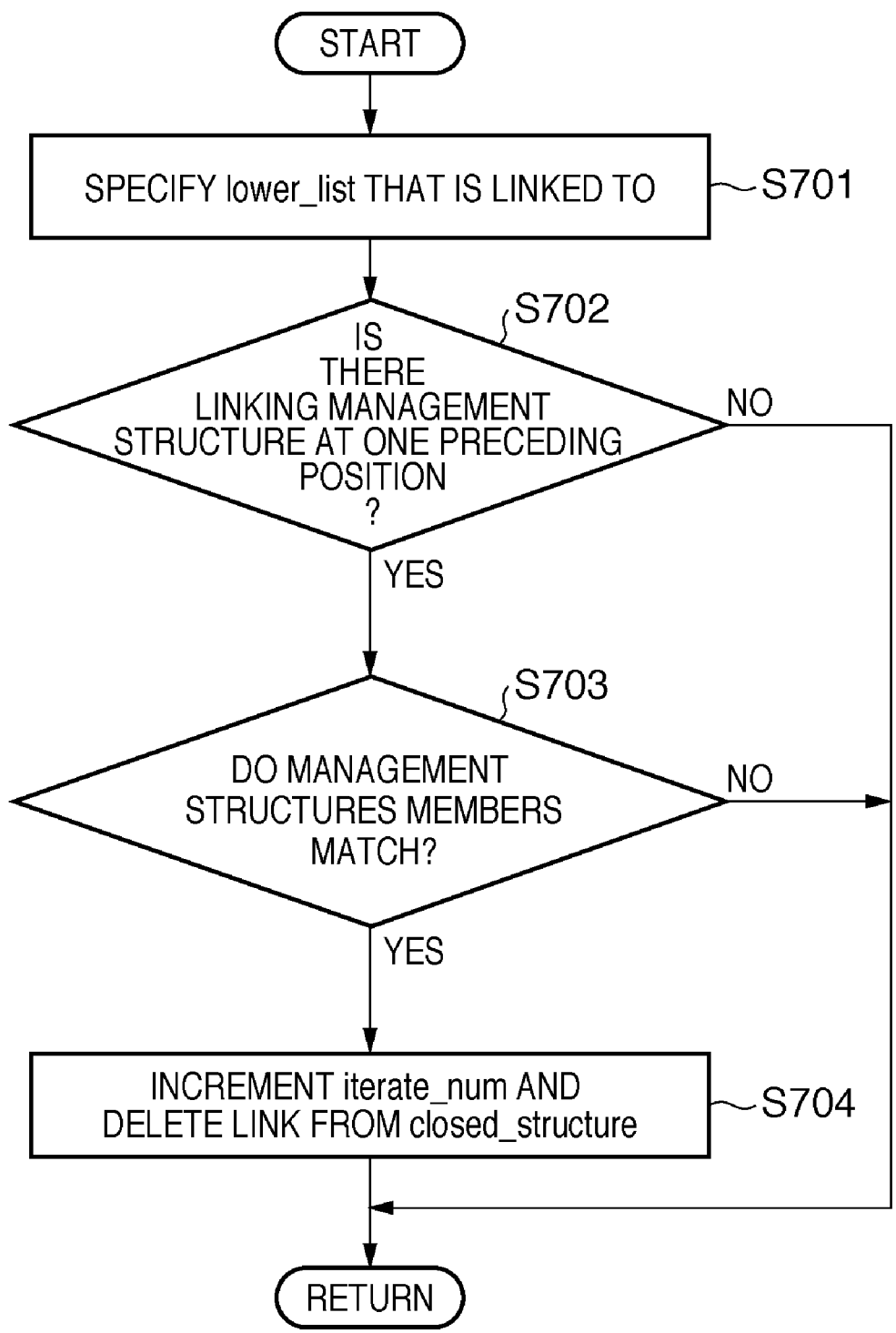
FIG. 7 is an operations flowchart of management structure collection processing.

FIG. 7 is an operation flowchart of management structure collection processing.

In step S701, following upper_link of closed_structure, lower_list of an upper hierarchy linking to closed_structure is specified.

In step S702, the CPU 101 checks whether or not there is a management structure that is linking at one preceding position of closed_structure in lower_list specified at step S701. If there is not, the CPU 101 ends the collection processing. If there is, the CPU 101 proceeds to step S703.

In step S703, the CPU 101 checks whether or not the management structure members and the closed_structure members are matching. If the members are not matching, the CPU 101 ends the collection processing. If they are matching, the CPU 101 proceeds to step S704.

In step S704, the CPU 101 increments the value iterate_num and deletes closed_structure from lower_list.

Figure 8:
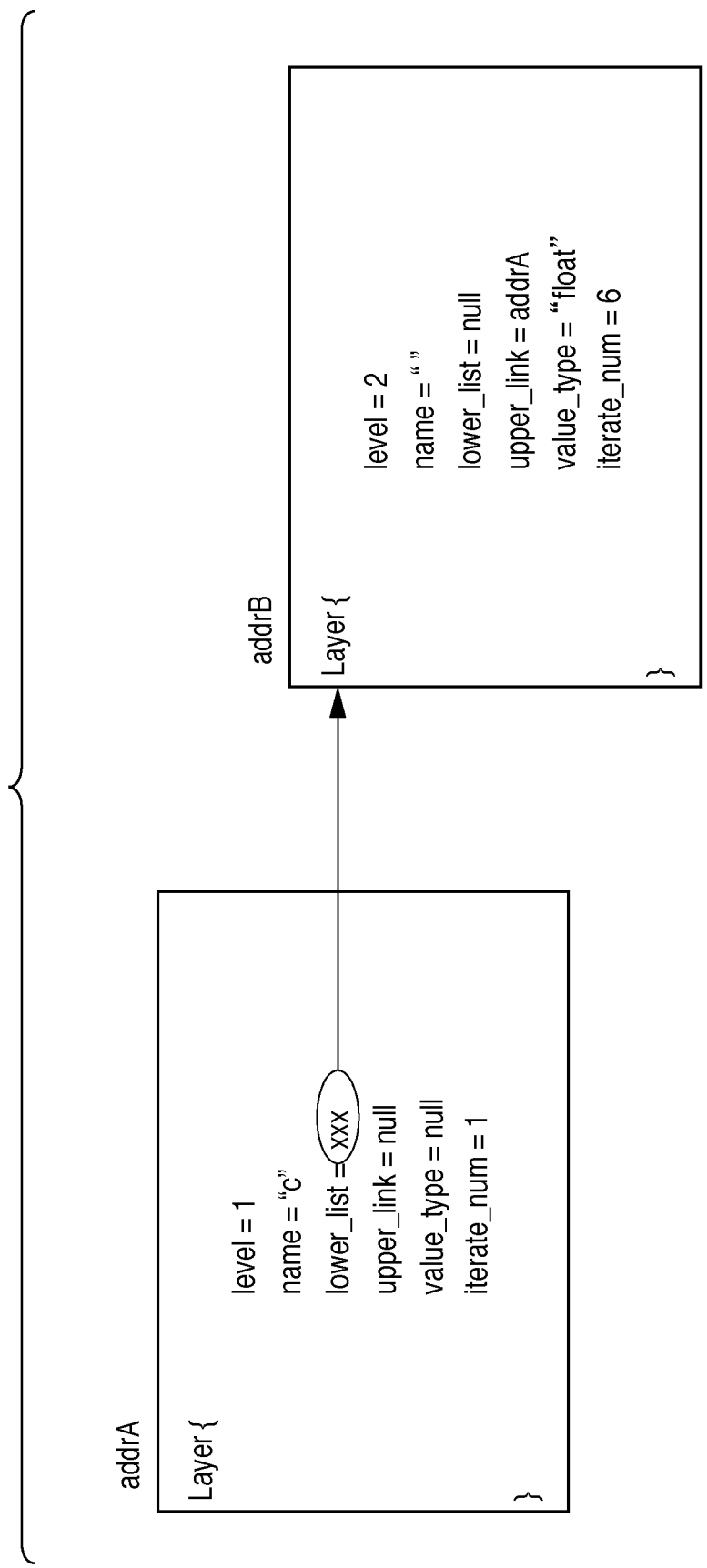
FIG. 8 is a view that illustratively shows structure information when collection processing is performed with respect to the structure information shown in FIG. 6.

FIG. 8 is a view that illustratively shows structure information when collection processing is performed with respect to the structure information shown in FIG. 6. It is found that six identical management structures ("addrB" to "addrG") shown in FIG. 6 are collected as "addrB". However, by setting iterate_num=6, it is shown that the management structure repeatedly appears six times.

Details of encoding processing operation (step S305)

Figure 9:
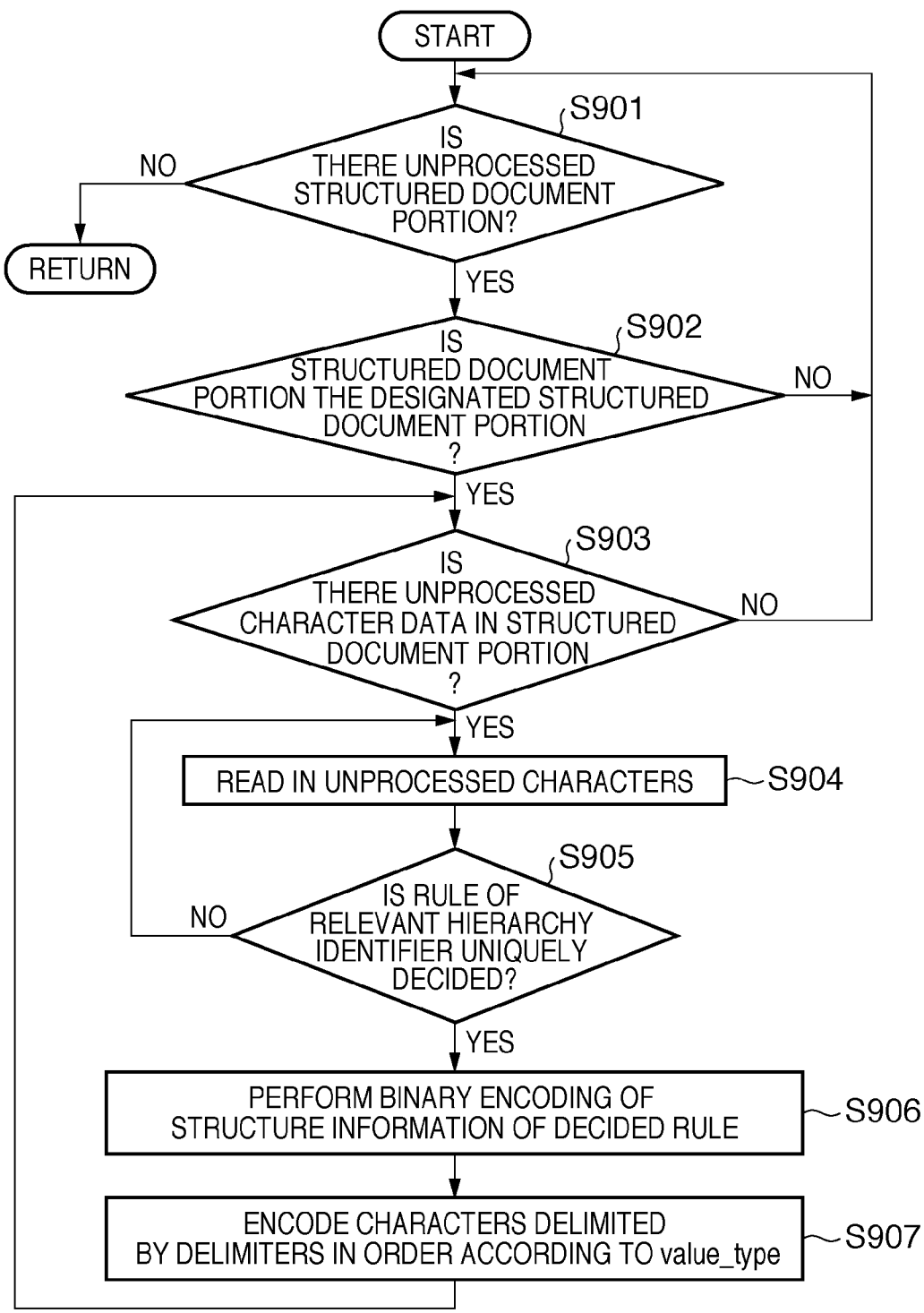
FIG. 9 is a detailed operation flowchart of encoding processing.

FIG. 9 is a flowchart that describes the detailed operations of encoding processing.

In step S901, a structured document portion of the input SVG data is read in. If there is no structured document portion, the processing ends.

In step S902, the CPU 101 determines whether or not the structured document portion that is read-in at step S901 is the structured document portion that is designated in step S301. More specifically, in this case, the CPU 101 checks whether or not it is the d attribute of the "path" element.

If the portion that is read-in is not the designated portion, the CPU 101 performs normal binary XML encoding and returns to step S901. If the read-in portion is the designated portion, the CPU 101 proceeds to step S903.

In step S903, the CPU 101 checks whether or not there is data in the structured document portion. If there is no data, the CPU 101 returns to step S901, because encoding processing is not necessary. If there is data, the CPU 101 reads in the data within the structured document portion in step S904.

In step S905, the CPU 101 distinguishes which rule designated in step S303 the data that is read-in at step S904 matches. At this time, if the CPU 101 cannot uniquely determine a rule, the CPU 101 returns to step S904 to read in the next characters and perform the distinction again. When the CPU 101 uniquely determines a rule, the operation advances to step S906.

In step S906, the CPU 101 acquires corresponding structure information that is generated in step S304 and performs binary encoding.

Figure 10:
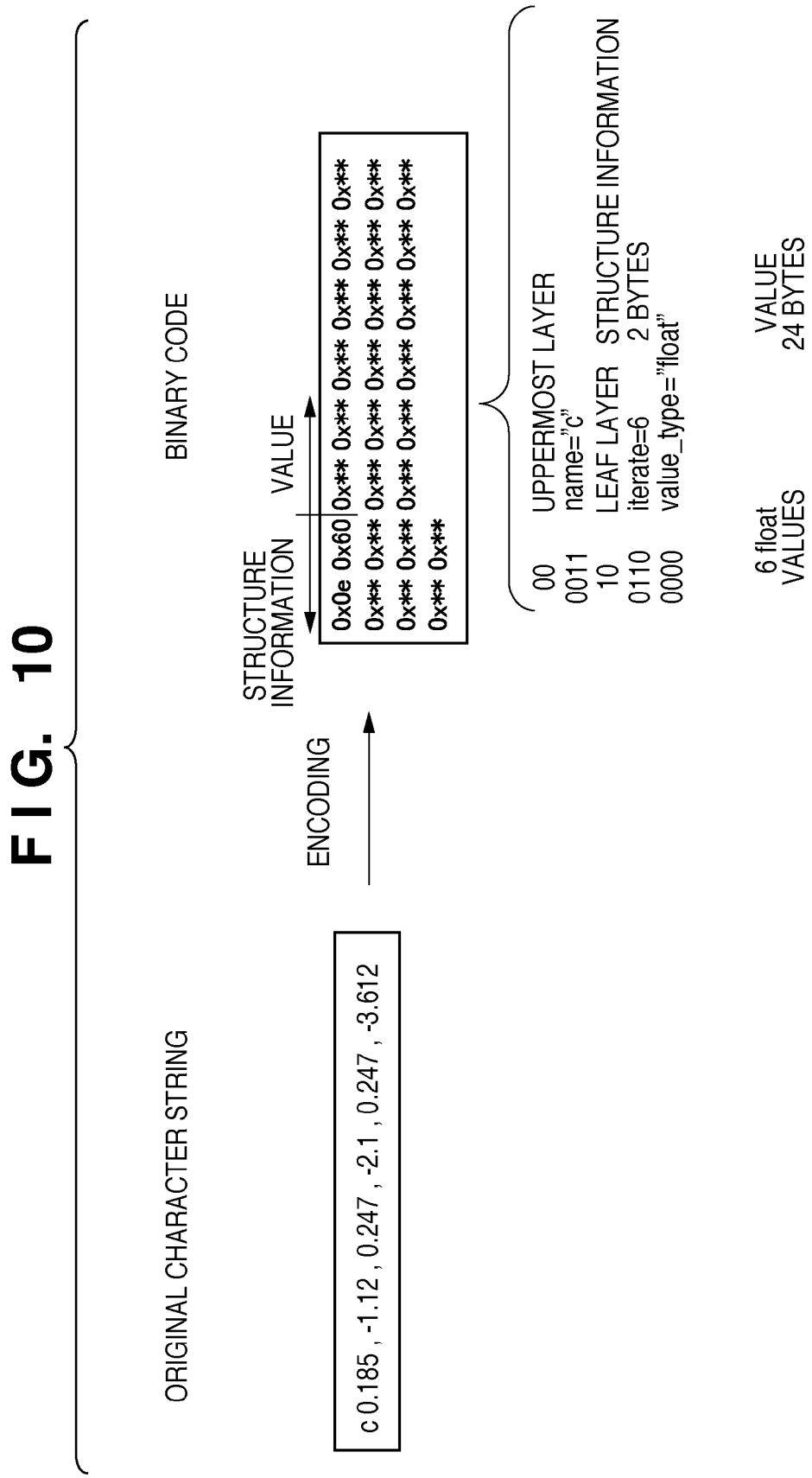
FIG. 10 is a view that shows a result obtained after executing binary encoding with respect to a drawing command "c" portion of an attribute value character string shown in FIG. 2.
Figure 12:
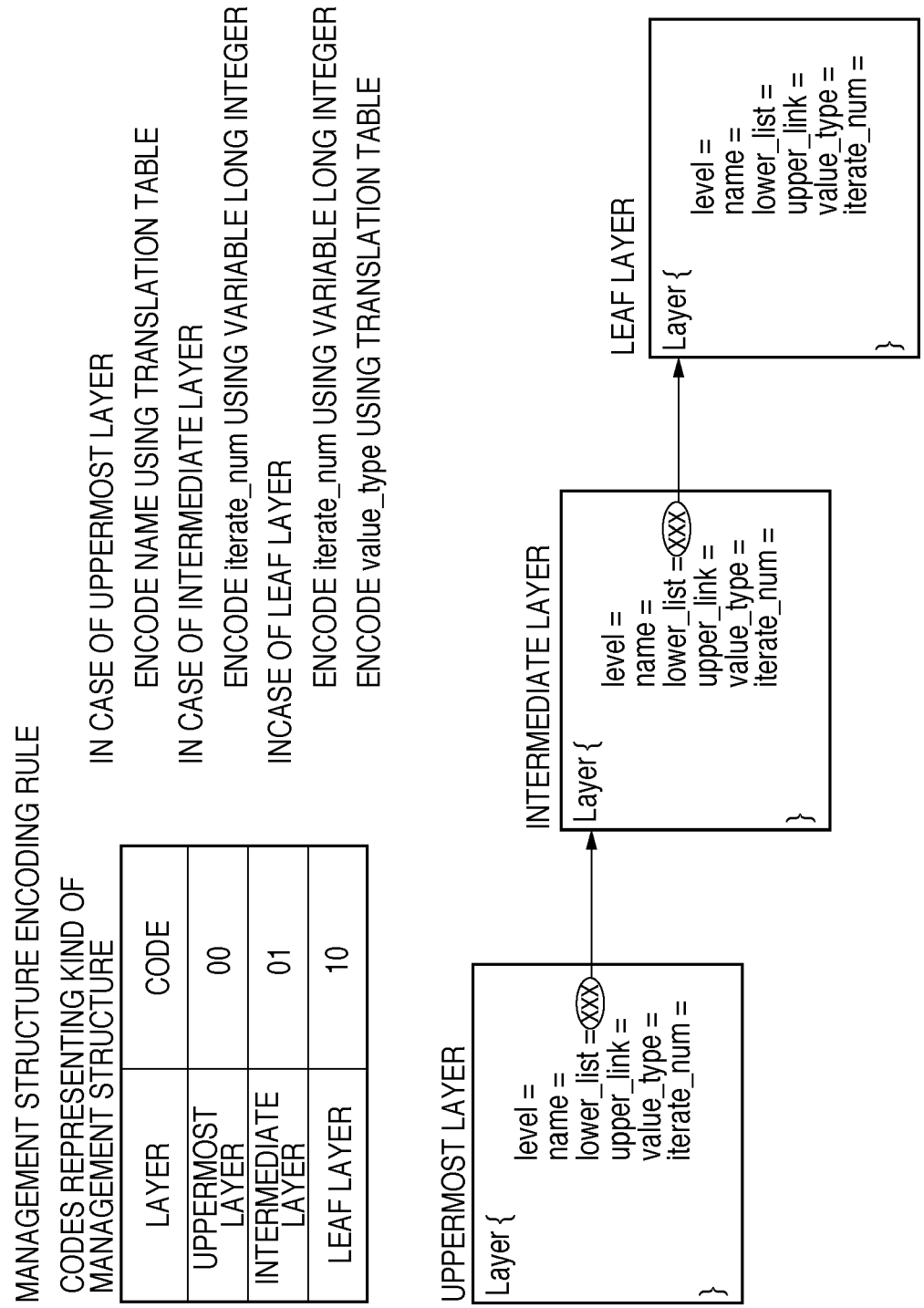
FIG. 12 is a view that illustrates another example of a translation table.

FIG. 10 is a view that shows the result obtained by executing binary encoding with respect to the drawing command "c" portion of the attribute value character string shown in FIG. 2. That is, the result is obtained by acquiring structure information with respect to rule 2 shown in FIG. 8 for the drawing command "c" portion of the attribute value character string shown in FIG. 2 and executing binary encoding.

The respective management structures are encoded using the type thereof and values of the members. More specifically,
for the uppermost hierarchy "00" is encoded,
for a management structure in the intermediate hierarchy "01" is encoded, and
for a leaf (leaf) management structure "10" is encoded.
Subsequently,
an identifier name (name) is encoded for the management structure in the uppermost hierarchy,
the number of iterations (iterate_num) is encoded for the management structure in the intermediate hierarchy, and
iterate_num and data type (value_type) are encoded for the leaf management structure.

FIG. 11 is a view that illustrates an example of a translation table. The above-described "name" and value_type are encoded using a translation table as shown in FIG. 11. iterate_num is encoded using a variable long integer. The first bit indicates the data length of the integer, and the subsequent bits indicate values.

The respective management structures are encoded in depth-first order from the management structure on the uppermost hierarchy. For example, the structure information shown in FIG. 8 comprises a management structure in the uppermost hierarchy and a leaf management structure. Consequently,
"00" is encoded for the uppermost hierarchy,
"0011" is encoded for name="c",
"10" is encoded for the leaf hierarchy,
"0110" is encoded for iterate_num=6, and
"0000" is encoded for value_type="float", in that order.

In step S907, character strings that are delimited by delimiters are encoded in order. When encoding, the CPU 101 refers to the value_type of the corresponding management structure and executes encoding. After encoding, the CPU 101 returns to step S903 to process the next character data of the structured document portion. As a result, as shown in FIG. 10, the "c" portion of the attribute value character string shown in FIG. 2 is encoded into six pieces of "float" type data.

In some cases, a rule of a hierarchy identifier designated in step S304 is repeatedly used when encoding. Since performing encoding each time produces redundancy, it is favorable to use a token of the converted structure information in step S305. For the encoded data of a token, the two bits "11" are added at the start to distinguish the data from encoded data of a management structure. Although a translation table may be prepared to appropriately allocate a value to a token, it is also possible to employ the identifier name itself as a token and use the translation table shown in FIG. 12.

As described above, according to the data encoding apparatus of the first embodiment, binary encoding can be efficiently executed even for data that includes elements having complex attribute values. More specifically, for the SVG data shown in FIG. 2, it is possible to perform binary encoding that takes into consideration the data structure with respect to the d attribute of a "path" element that has conventionally been encoded as text. As a result, effects including reduction of data sizes and improvements in analysis processing speeds can be obtained.

In this connection, on the decoder (decoding) side, processing is performed that is the reverse of the encoding procedures in order to read the encoded data. At that time, the decoder recognizes the data structure by reading the structure information at the start of the data, and secures a required region and sequentially reads in values.

Second Embodiment

According to the second embodiment, encoding is described in a case in which attribute values indicate a two-dimensional array. The configuration of the apparatus is the same as in the first embodiment, and a description is thus omitted here.

<Description of Animation Processing for SVG Data>

There is a description of animation processing as shown in FIG. 13 in SVG. A "type" attribute indicates the type of animation processing, and indicates movement processing in the case of "translate". At this time, the moving distance is described by a "values" attribute, an X direction value and a Y direction value are separated by a "," delimiter, and an X, Y pair are indicated by a ";" delimiter.

Further, execution timings can be designated for animation processing, and are indicated using a ";" delimiter in the "keyTimes" attribute. The respective timings that are described with the "keyTimes" attribute correspond to the respective pairs of X and Y described with the "values" attribute.

Therefore, when encoding as an array structure, correspondence with the "keyTimes" attribute is facilitated by taking the "values" attribute as a two-dimensional array. The array size depends on the description contents of the attribute value and is undefined.

<Apparatus Operation>

Overall Operation

Operations of the information processing apparatus relating to the second embodiment will now be described referring to FIG. 3, similarly to the first embodiment. However, a method of encoding the SVG data shown in FIG. 13 will also be described.

In step S301, the CPU 101 reads in SVG data and designates a processing target portion (structure portion) included in the SVG data. In this case, the CPU 101 accepts designation of a "values" attribute and a "keyTimes" attribute of an "animateTransform" element of the SVG data shown in FIG. 13.

In step S302, a data structure is decided for the processing target portion that is designated in step S301. It is favorable to adopt a configuration in which the data structure is determined by accepting a designation from a user via an input device. In this case, an array structure of drawing command units as shown in the lower column in FIG. 13 is designated.

In step S303, hierarchy information is set with respect to the processing target portion designated in step S301 in accordance with the data structure decided at step S302. More specifically, hierarchies and identifiers are designated with respect to delimiters included in the processing target portion designated in step S301.

FIG. 14 is a view that illustratively shows designation of hierarchy information. In this case, in addition to the characters "," and ";", a starting position (start) of the attribute value is treated as a delimiter. It is thereby possible to organize the entire attribute values as a single array structure.

The hierarchy is as follows: "start" as the array unit is in the uppermost hierarchy, the delimiter ";" of X, Y pairs is in the second hierarchy, and the delimiter "," of the X direction value and the Y direction value is in the third hierarchy. In this connection, since there is only one array inside an attribute value, an identifier name is not designated.

Since the number of X, Y pairs depends on the description contents of the attribute value, designation of the delimiters ";" and "," is repeated as shown in FIG. 14. Data type designation involves designating "float" type for the X direction and Y direction values.

In step S304, the hierarchy information designated in step S303 is converted into structure information.

Figure 15:
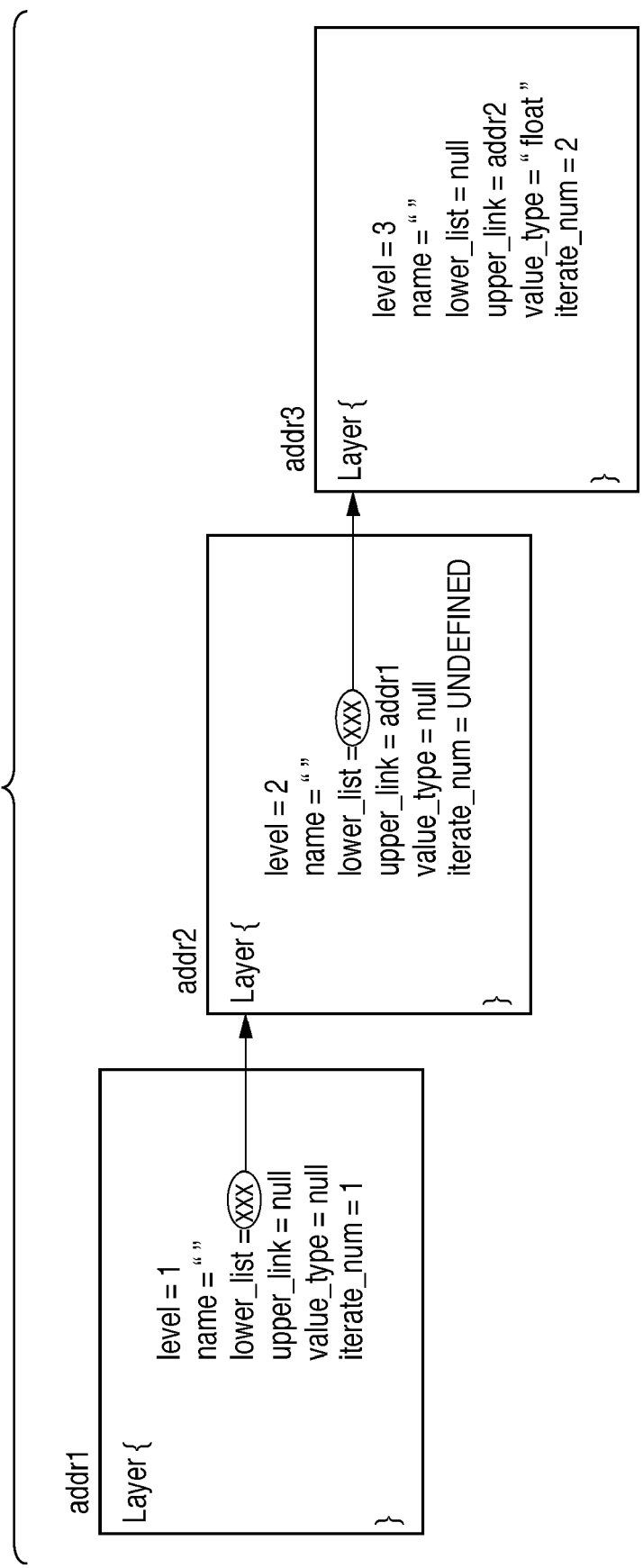
FIG. 15 is a view that illustratively shows a result obtained by converting hierarchy information of a rule for a "values" attribute shown in FIG. 14 into structure information.

FIG. 15 is a view that illustratively shows a result obtained by converting hierarchy information of a rule for the "values" attribute shown in FIG. 14 into structure information. Since the conversion processing is performed according to the flow shown in FIG. 5 and FIG. 7, similarly to the first embodiment, a description thereof is omitted here. However, as described above, the number of X, Y pairs of the "values" attribute shown in FIG. 13 is not known until the input data is actually read in. Accordingly, iterate_num of the management structure "addr2" is undefined, and iterate_num of "addr3" is 2 as the total of X direction and Y direction.

In step S305, SVG data that is input at step S301 is encoded using the hierarchy identifier designated at step S303 and the structure information that is obtained by conversion in step S304.

Details of Encoding Processing Operation (Step S305)

Encoding is executed according to the flowchart shown in FIG. 9, similarly to the first embodiment.

Figure 16:
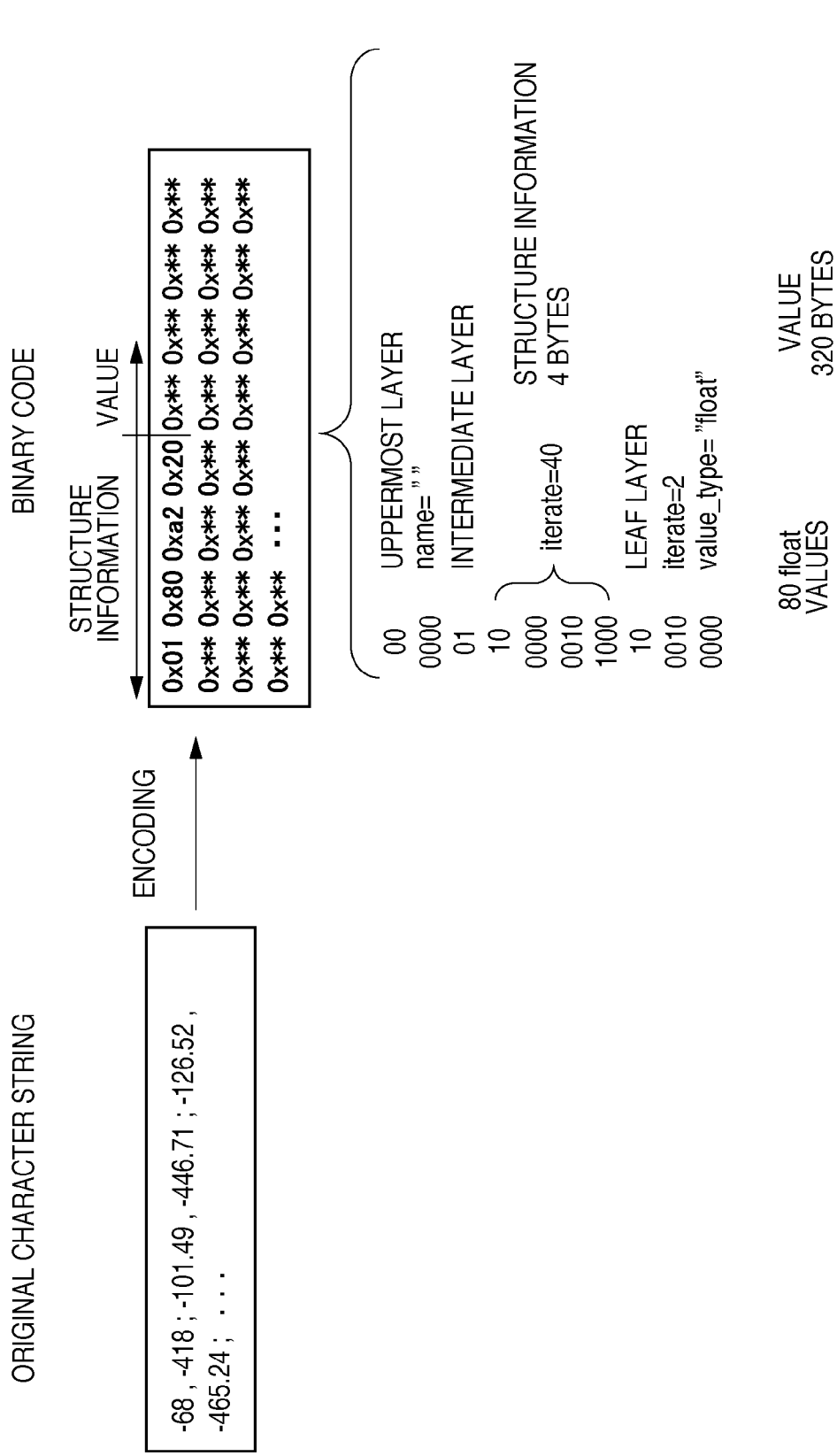
FIG. 16 is a view that shows a result obtained after executing binary encoding with respect to values of a "values" attribute shown in FIG. 13.

FIG. 16 is a view that illustrates the result of executing binary encoding with respect to the values of the "values" attribute shown in FIG. 13. More specifically, the structure information shown in FIG. 15 is encoded in order according to the same encoding rule as shown in the upper column of FIG. 12. That is, "00" is encoded for the uppermost hierarchy,
"1111" is encoded for name=" "
"01" is encoded for the intermediate hierarchy,
a 14-bit place holder is encoded for iterate_num=undefined,
"10" is encoded for the leaf hierarchy,
"0010" is encoded for iterate_num=2, and
"0000" is encoded for value_type="float".

In step S907, character strings that are delimited by delimiters are encoded in order. In this case, it is assumed there are 40 X, Y pairs of the "values" attribute shown in FIG. 12. Accordingly, they are encoded into a total of 80 pieces of "float" type data. At this time, since the number of X, Y pairs is identified, the place holder is replaced with "10000000101000" that indicates a variable long integer "40".

As described above, according to the data encoding apparatus of the second embodiment, binary encoding can be efficiently executed even with respect to data including an element that has a two-dimensional array attribute value. In this connection, the array is not limited to two-dimensions, and is extensible to N (N is a natural number) dimensions.

Third Embodiment

According to the third embodiment, encoding in a case in which an attribute value indicates a two-dimensional array of columns×rows is described. Since the apparatus configuration is the same as in the first embodiment, a description thereof is omitted.

<Description of Conversion Processing for SVG Data>

There is a description for conversion processing of drawing data as shown in FIG. 17 for SVG. A "transform" attribute indicates the contents of conversion processing, and "matrix" indicates that the data is a transformation matrix. At this time, each element of the matrix is arranged using the delimiter ",".

<Apparatus Operation>

Overall Operation

In this case, similarly to the second embodiment, efficient processing is performed by adopting a two-dimensional array structure of columns×rows. The operation of the information processing apparatus according to the third embodiment will now be described referring to FIG. 3, similarly to the first embodiment. However, a method of encoding SVG data shown in FIG. 17 will be described.

In step S301, the CPU 101 reads in SVG data and designates a processing target portion (structure portion) included in the SVG data. In this case, the CPU 101 accepts designation of a "transform" attribute of a g element of the SVG data shown in FIG. 17.

In step S302, a data structure is determined with respect to the processing target portion that is designated in step S301. It is favorable to adopt a configuration in which the data structure is determined by accepting a designation from a user through an input device. In this case, an array structure as shown in the lower column in FIG. 17 is designated.

In step S303, the CPU 101 sets hierarchy information with respect to the processing target portion that is designated in step S301 in accordance with the data structure determined in step S302. More specifically, the CPU 101 designates a hierarchy and an identifier for delimiters included in the processing target portion designated in step S301.

FIG. 18 is a view that illustratively shows designation of hierarchy information. In this case, although hierarchy information is designated by the characters "matrix (" and ",", since the character ")" is unnecessary and hinders the encoding processing, "delete" is designated therefor.

The hierarchy is as follows: "matrix (" as the array unit is in the uppermost hierarchy, and a delimiter "," of each matrix element is in the second hierarchy. For the identifier name, "matrix" is designated, and "float" type is designated for the data type designation.

In step S304, the hierarchy information designated in step S303 is converted into structure information.

Figure 19:
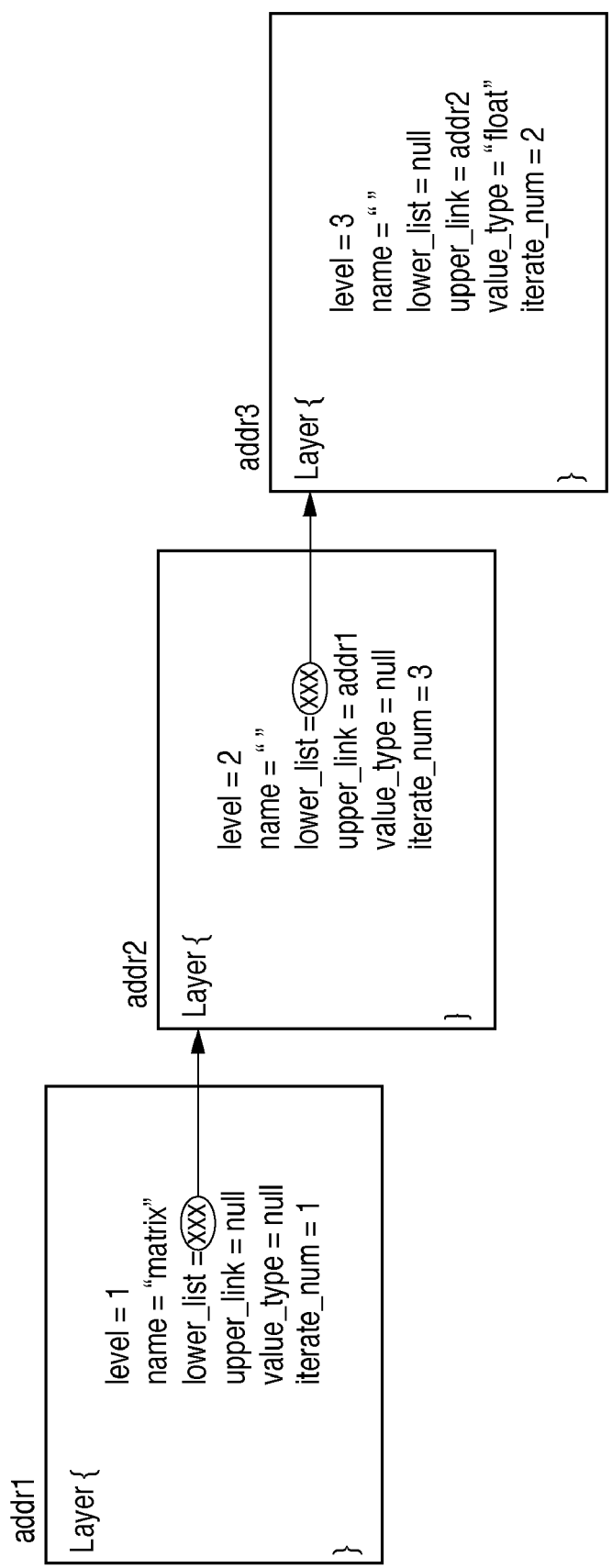
FIG. 19 is a view that illustratively shows a result obtained by converting hierarchy information of a rule shown in FIG. 18 into structure information.

FIG. 19 is a view that illustratively shows a result obtained by converting hierarchy information of the rule shown in FIG. 18 into structure information. Since the conversion processing is performed according to the flow shown in FIG. 5 and FIG. 7, similarly to the first embodiment, a description thereof is omitted here. However, the iterate_num of "addr2" is 3 as the number of columns, and the iterate_num of "addr3" is 2 as the number of rows.

In step S305, SVG data that is input in step S301 is encoded using the hierarchy identifier designated in step S303 and the structure information that is obtained by conversion in step S304.

Details of Encoding Processing Operation (Step S305)

Encoding is executed according to the flowchart shown in FIG. 9, similarly to the first embodiment.

Figure 20:
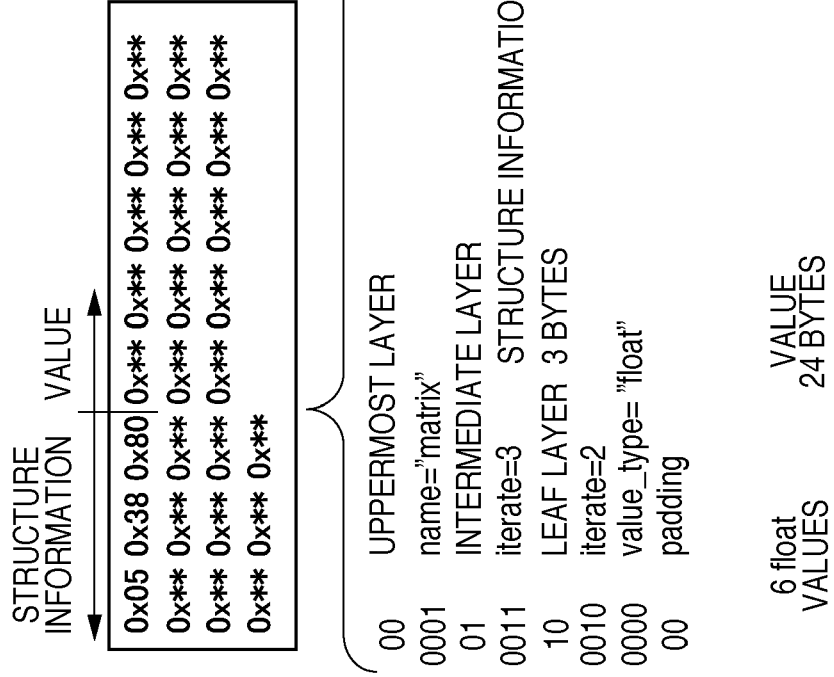
FIG. 20 is a view that shows a result obtained after executing binary encoding with respect to values of a "transform" attribute shown in FIG. 17.

FIG. 20 is a view that shows the result of executing binary encoding with respect to values of the "transform" attribute shown in FIG. 17. More specifically, the structure information shown in FIG. 19 is encoded in order according to the same encoding rule as shown in the upper column of FIG. 12. That is, "00" is encoded for the uppermost hierarchy, "0001" is encoded for name="matrix" (a translation table is prepared similarly to the first embodiment)

"01" is encoded for the intermediate hierarchy,

"0011" is encoded for iterate_num=3,

"10" is encoded for the leaf hierarchy,

"0010" is encoded for iterate_num=2, and

"0000" is encoded for value_type="float".

In this connection, padding "00" is attached at the end so as to end in a bite unit (8-bit unit).

In step S907, character strings that are delimited by delimiters are encoded in order. In this case, the character strings are encoded into six pieces of "float" type data.

As described above, according to the data encoding apparatus of the third embodiment, binary encoding can be executed efficiently even with respect to data including an element that has an attribute value with a two-dimensional array of columns×rows.

Fourth Embodiment

According to the fourth embodiment, encoding of a sub-element of a structured document is described. Since the apparatus configuration is the same as in the first embodiment, a description thereof is omitted.

<Description That Converts Method Invocation Into Message Data>

SOAP is a messaging technology that uses XML. In SOAP, there is a description that converts a method invocation into message data.

FIG. 21 is a view that illustratively shows a description that converts a method invocation into message data. A <myMethod> element is described as a sub-element of a <soap:body> element. The <myMethod> element indicates a method name, and sub-elements thereof indicate each method parameter.

<Apparatus Operation>

Overall Operation

In this case also, similarly to the first embodiment, a reduction in data size and speeding-up of reception processing are achieved by encoding as an array structure. Here, an embodiment is described for the case of a sub-element of a structured document as shown in FIG. 21.

In step S301, the CPU 101 reads in SOAP XML data that is converted from the method readout, and designates a processing target portion (structure portion) included in the data. In this case, the CPU 101 accepts designation of the contents of the "myMethod" element in the data shown in FIG. 21.

In step S302, a data structure is decided for the processing target portion that is designated in step S301. It is favorable to adopt a configuration in which the data structure is determined by accepting a designation from a user via an input device. In this case, an array structure as shown in the lower column in FIG. 21 is designated.

In step S303, the CPU 101 sets hierarchy information with respect to the processing target portion that is designated in step S301 in accordance with the data structure determined in step S302.

FIG. 22 is a view that illustratively shows designation of hierarchy information. In this case, the CPU 101 designates an XML element and not an attribute value (character).

The hierarchy is as follows. The "MyMethod" element as the array unit is in the uppermost hierarchy, and an x element and a y element are in a second hierarchy, respectively. According to the present embodiment, "myMethod" is designated as the identifier name. As the data type designation, "int" type is designated for the x element and "float" type is designated for the y element. It is also possible to interpret the XML "xsi:type" attribute description to automatically set the type.

In step S304, the hierarchy information designated at step S303 is converted into structure information.

Figure 23:
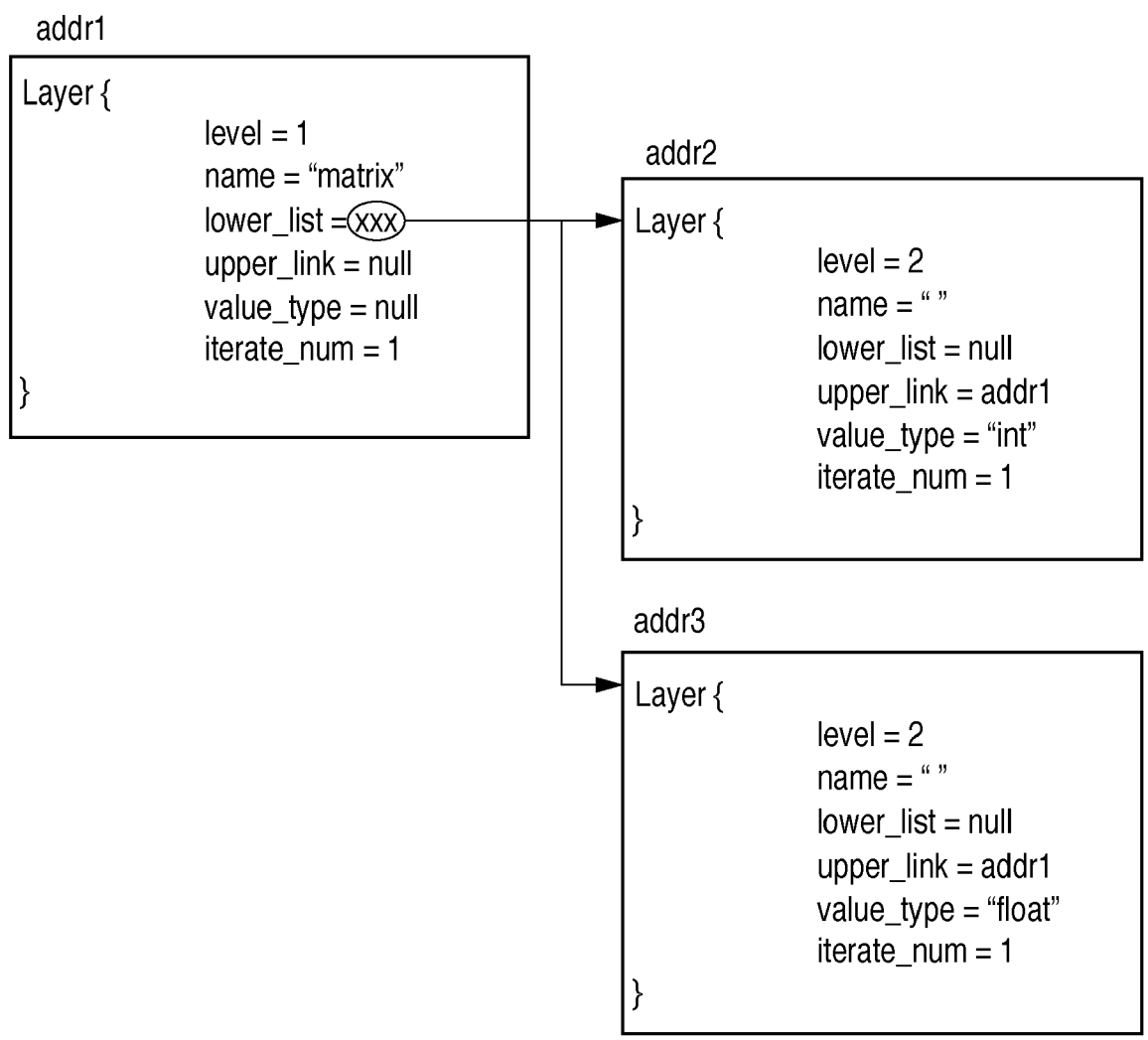
FIG. 23 is a view that illustratively shows a result obtained when hierarchy information of a rule shown in FIG. 22 is converted into structure information.

FIG. 23 is a view that illustratively shows a result obtained by converting hierarchy information of the rule shown in FIG. 22 into structure information. Since the conversion processing is performed according to the flow shown in FIG. 5 and FIG. 7, similarly to the first embodiment, a description thereof is omitted here. However, the iterate_num of "addr2" is 1 as the x element, and the iterate_num of "addr3" is 1 as the y element.

In step S305, data that is input in step S301 is encoded using the hierarchy identifier that is designated in step S303 and the structure information that is obtained by conversion in step S304.

Details of Encoding Processing Operation (Step S305)

Encoding is executed according to the flowchart shown in FIG. 9, similarly to the first embodiment.

FIG. 24 is a view that shows the result of executing binary encoding with respect to values of the "soap:body" element shown in FIG. 21. More specifically, the structure information shown in FIG. 23 is encoded in order according to the same encoding rule as that shown in the upper column of FIG. 12. That is, "00" is encoded for the uppermost hierarchy,
"0001" is encoded for name="myMethod" (a translation table is prepared similarly to the first embodiment)
"10" is encoded for the leaf hierarchy,
"0001" is encoded for iterate_num=1,
"0010" is encoded for value_type="int",
"10" is encoded for the leaf hierarchy,
"0001" is encoded for iterate_num=1, and
"0000" is encoded for value_type="float".

In this connection, padding "000000" is attached to the end so as to end in a bite unit.

In step S907, character strings that are delimited by delimiters are encoded in order. In this case, the values of the elements are encoded. The values are respectively encoded into one piece of "int" type data as value of the x element and one piece of "float" type data as the value of the y element.

As described above, according to the data encoding apparatus of the fourth embodiment, binary encoding can be executed efficiently even with respect to SOAP XML data.

Other Embodiments

Although examples of embodiments of the present invention were described in detail above, the present invention may also be applied to a system constituted by a plurality of devices or to an apparatus comprising a single device.

Furthermore, the present invention can be implemented by supplying a computer program which implements the functions of the foregoing embodiments directly or indirectly to a system or apparatus, reading the supplied program code with a computer of the system or apparatus, and then executing the program code. Accordingly, since the functional processes of the present invention are implemented by computer, the program code itself installed in the computer also implements the present invention. In other words, the claims of the present invention also cover a computer program for the purpose of implementing the functional processes of the present invention.

In this case, so long as the system or apparatus has the functions of the program, the program may be executed in any form, for example, as object code, a program executed by an interpreter, or script data supplied to an operating system.

Examples of recording media that can be used for supplying the program are a floppy (registered trademark) disk, a hard disk, an optical disk (CD, DVD), a magneto-optical disk, a magnetic tape, a non-volatile memory card, and a ROM.

Further, it is to be understood that the functions of the above described embodiments may be accomplished not only by a computer executing a read-out program code, but also by causing an OS (operating system) or the like which operates on the computer to perform a part or all of the actual operations based on instructions of the program code.

Furthermore, it is to be understood that the functions of the above described embodiments may be accomplished by writing a program code read out from the storage medium into a memory provided on an expansion board inserted into a computer or a memory provided in an expansion unit connected to the computer and then causing a CPU or the like provided in the expansion board or the expansion unit to perform a part or all of the actual operations based on instructions of the program code.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-244443, filed Sep. 20, 2007, which is hereby incorporated by reference herein in its entirety.

What is claimed is:

1. An information processing apparatus, comprising:
a file input unit that inputs a file including an element having a data stream of a predetermined format as an attribute value;
a hierarchy information setting unit that, with respect to each of one or more delimiters included in the data stream of the predetermined format, sets hierarchy information that indicates a hierarchical position in the data stream of data relating to the delimiter, wherein a data type of the data relating to the delimiter is set to a numerical type;
a structure information generating unit that generates structure information that defines a mutual relation between one or more pieces of hierarchy information that are set with the hierarchy information setting unit, wherein the structure information generating unit generates the structure information as an N-dimensional (N is a natural number) array structure;
a designating unit that designates a region of the data stream of the predetermined format from a file that is input by the file input unit; and
an encoding unit that detects the delimiter from the region that is designated by the designating unit, and performs binary encoding with respect to a data stream of the region based on a preset structured description language, based on the detected delimiter and the structure information,
wherein the structure information generating unit comprises:
a determination unit that determines, when generating the structure information, whether or not a sequence of a plurality of identical structures is present; and
a collection unit that collects, if the determination unit determines that a sequence of a plurality of identical structures is present, the plurality of identical structures by representing the identical structures as a pair of one structure and an iteration number and deleting the identical structures.

2. The information processing apparatus according to claim 1,
wherein the hierarchy information setting unit comprises a data type setting unit that sets the data type of data relating to the delimiter, and
wherein the encoding unit encodes data that is included in a data stream of the region based on the data type that is set by the data type setting unit.

3. The information processing apparatus according to claim 1,
wherein the structure information is described based on the preset structured description language, and wherein the encoding unit encodes data included in the data stream of the region with the structured description language that describes the structure information.

4. The information processing apparatus according to claim 1,
wherein the preset structured description language is binary XML.

5. An encoding method, comprising:
a file input step of inputting a file including an element having a data stream of a predetermined format as an attribute value;
a hierarchy information setting step of setting, with respect to each of one or more delimiters included in the data stream of the predetermined format, hierarchy information that indicates a hierarchical position in the data stream of data relating to the delimiter, wherein a data type of the data relating to the delimiter is set to a numerical type;
a structure information generating step of generating structure information that defines a mutual relation between one or more pieces of hierarchy information that are set in the hierarchy information setting step, wherein the structure information is generated as an N-dimensional (N is a natural number) array structure;
a designating step of designating a region of the data stream of the predetermined format from a file that is input in the file input step; and
an encoding step of detecting the delimiter from the region that is designated in the designating step, and performs binary encoding with respect to a data stream of the region based on a preset structured description language, based on the detected delimiter and the structure information,
wherein the structure information generating step comprises:
a determination step of determining, when generating the structure information, whether or not a sequence of a plurality of identical structures is present; and
a collection step of collecting, if the determination step determines that a sequence of a plurality of identical structures is present, the plurality of identical structures by representing the identical structures as a pair of one structure and an iteration number and deleting the identical structures,
wherein at least one of the above steps is performed by at least one processor.

6. A non-transitory computer-readable recording medium storing a program, which when executed by a computer, causes the performance of:
a file input step of inputting a file including an element having a data stream of a predetermined format as an attribute value;
a hierarchy information setting step of setting, with respect to each of one or more delimiters included in the data stream of the predetermined format, hierarchy information that indicates a hierarchical position in the data stream of data relating to the delimiter, wherein a data type of the data relating to the delimiter is set to a numerical type;
a structure information generating step of generating structure information that defines a mutual relation between one or more pieces of hierarchy information that are set in the hierarchy information setting step, wherein the structure information is generated as an N-dimensional (N is a natural number) array structure;
a designating step of designating a region of the data stream of the predetermined format from a file that is input in the file input step; and
an encoding step of detecting the delimiter from the region that is designated in the designating step, and performs binary encoding with respect to a data stream of the region based on a preset structured description language, based on the detected delimiter and the structure information,
wherein the structure information generating step comprises:
a determination step of determining, when generating the structure information, whether or not a sequence of a plurality of identical structures is present; and
a collection step of collecting, if the determination step determines that a sequence of a plurality of identical structures is present, the plurality of identical structures by representing the identical structures as a pair of one structure and an iteration number and deleting the identical structures.

* * * * *